(12) United States Patent
Sood et al.

(10) Patent No.: US 8,198,916 B2
(45) Date of Patent: Jun. 12, 2012

(54) DIGITAL SIGNAL VOLTAGE LEVEL SHIFTER

(75) Inventors: Santosh Sood, New Delhi (IN); Neeraj Kumar, Budhlada (IN); Saurabh Srivastava, Jhansi (IN)

(73) Assignee: Freescale Semiconductor, Inc., Austin, TX (US)

( * ) Notice: Subject to any disclaimer, the term of this patent is extended or adjusted under 35 U.S.C. 154(b) by 66 days.

(21) Appl. No.: 12/871,864

(22) Filed: Aug. 30, 2010

(65) Prior Publication Data

US 2012/0049887 A1    Mar. 1, 2012

(51) Int. Cl.
   *H03K 19/0175* (2006.01)
(52) U.S. Cl. ............................. 326/80; 326/68; 327/333
(58) Field of Classification Search ............. 326/62–63, 326/68, 80–83, 86–87; 327/333
   See application file for complete search history.

(56) References Cited

U.S. PATENT DOCUMENTS

| | | | |
|---|---|---|---|
| 6,734,705 B2 * | 5/2004 | Pulkin et al. | 326/68 |
| 6,954,100 B2 | 10/2005 | Dharne | |
| 7,002,371 B2 | 2/2006 | Kase | |
| 7,009,424 B2 | 3/2006 | Khan et al. | |
| 7,061,299 B2 | 6/2006 | Khan | |
| 7,268,588 B2 | 9/2007 | Sanchez | |
| 7,382,158 B2 | 6/2008 | Kimura | |
| 7,397,297 B2 | 7/2008 | Kimura | |
| 7,443,223 B2 | 10/2008 | Bajkowski | |
| 7,446,566 B1 | 11/2008 | Chrudimsky | |
| 7,501,876 B2 | 3/2009 | Kimura | |
| 7,551,017 B2 | 6/2009 | Felder | |
| 7,629,830 B1 | 12/2009 | Rubin | |
| 7,683,668 B1 | 3/2010 | Thakur | |
| 2005/0122133 A1 * | 6/2005 | Eldredge et al. | 326/63 |
| 2009/0115456 A1 * | 5/2009 | Chiang | 326/80 |

* cited by examiner

*Primary Examiner* — Shawki S Ismail
*Assistant Examiner* — Jany Tran
(74) *Attorney, Agent, or Firm* — Charles Bergere

(57) ABSTRACT

A digital signal voltage level shifter includes an edge detector that detects assertion of a digital input signal from a first logic circuit in a source voltage domain, and an output module triggered by the edge detector for asserting a digital output signal corresponding to the digital input signal for a second logic circuit in a destination voltage domain. The edge detector and the output module are supplied with power only from a power supply of the destination voltage domain and are not connected to a power supply of the source voltage domain.

6 Claims, 4 Drawing Sheets

US 8,198,916 B2

DIGITAL SIGNAL VOLTAGE LEVEL SHIFTER

BACKGROUND OF THE INVENTION

The present invention relates generally to digital logic circuits and, more particularly, to a digital signal voltage level shifter and a method for shifting a digital signal between two voltage levels.

Digital logic circuits are widely used in the areas of electronics and computers. However, the various digital logic circuits that communicate with one another may operate at different power supply voltages. The voltages of digital signals in the different voltage domains are then different. For example, a digital integrated circuit may include a central logic core that operates at a low power supply voltage, since operating at the lower voltage reduces power consumption. On the other hand, an input/output (I/O) section may operate at a higher power supply voltage level, so that the logic levels of the I/O section are at a higher voltage than the logic core to ensure a higher signal to noise ratio. For example, the I/O section may operate at supply voltages ranging from 3.3V to 5V, while the logic core operates at 0.5V to 1.5V. The logic levels of standard interface lines may operate at yet another voltage. Therefore, interface circuits are required to ensure smooth communication of digital signals between digital logic circuits in different voltage domains operating at different voltages even if they are part of the same integrated circuit. Another example is a Universal Serial Bus ('USB') communication between a source in a low voltage domain sending data at a certain frequency, such as 100 MHz for example, with a low peak-to-peak voltage swing, such as 1.2 V for example, to be received by a destination block in a high voltage domain whose signals have a higher peak-to-peak voltage swing, such as 2.5 V for example. A voltage level shifter interface may enable communication between the different voltage domains at the same frequency.

In particular, an interface circuit is required that allows a shift in the voltage of a digital signal between a low supply voltage (VDDL) level and a higher supply voltage (VDDH) level. This voltage level shifter acts as an interface between a logic circuit operating in the low power supply voltage (VDDL) domain and a logic circuit operating in the higher power supply voltage (VDDH) domain. However, a voltage level shifter may also be used as an interface between a logic circuit operating in the higher power supply voltage (VDDH) domain and a logic circuit operating in the low power supply voltage (VDDL) domain.

If the voltage level shifter operates on dual source and destination power supply voltages, that is to say with both VDDL and VDDH power supply voltages, power supply rail connections of the voltage level shifter to both VDDL and VDDH are required. Extra connections lead to congestion in the circuit layout, as well as extra pin counts and design complexity, notably of the power supply grid.

In integrated circuits, such as system-on-chip ('SOC's) with more than one voltage domain, there may be thousands of signals that require voltage level shifting. Power consumption is a constant preoccupation. The power consumption of the voltage level shifters is significant. The rising and falling edges of digital signals are not instantaneous transitions but exhibit slew. Voltage level shifters may exhibit increased power consumption in the presence of such slew, especially if the switching ON and OFF of different switches are not simultaneous and establish even temporary leakage paths between the input terminal and power supply rails at a different voltage, for example.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale.

DETAILED DESCRIPTION OF PREFERRED EMBODIMENTS OF THE INVENTION

Figure 1:
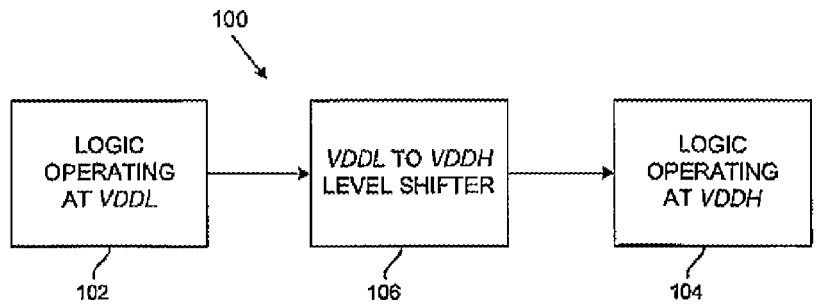
FIG. 1 is a schematic block diagram illustrating the operation of a digital signal voltage level shifter.

FIG. 1 shows a part of a logic system 100 having logic circuits 102 operating in a first voltage domain supplied with power at a first power supply voltage, logic circuits 104 operating in a second voltage domain supplied with power at a second power supply voltage and a voltage level shifter 106. The voltage level shifter 106 receives binary signals from the logic circuits 102 whose voltage levels correspond to the first power supply voltage, and applies to the logic circuits 104 corresponding binary signals whose voltage levels correspond to the second power supply voltage. In the example of a system shown in FIG. 1, the first voltage domain 102 operates at a lower supply voltage VDDL and the second voltage domain 104 operates at a higher supply voltage VDDH, the voltage level shifter 106 shifting the voltage levels of the input signals it receives from the lower voltage level to the higher voltage level. However, it will be appreciated that the voltage level shifter 106 may alternatively be adapted to shift the voltage levels of the input signals from the higher voltage level VDDH to the lower voltage level VDDL.

Figure 2:
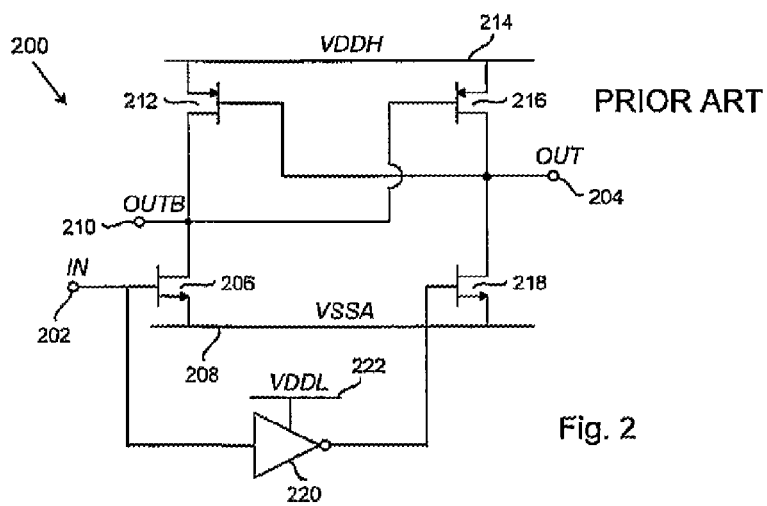
FIG. 2 is a schematic circuit diagram of a conventional digital signal voltage level shifter.

FIG. 2 shows a simplified circuit diagram of a known voltage level shifter 200 which operates on dual power supply voltages VDDH and VDDL. The voltage level shifter 200 comprises an input terminal 202 which receives binary signals IN from a logic circuit in a first voltage domain corresponding to the low power supply voltage VDDL, and an active-high output terminal 204 to which the voltage level shifter 200 applies corresponding binary signals OUT for a logic circuit in a second voltage domain corresponding to the high power supply voltage VDDH. The input terminal 202 is connected to a gate of an n-type metal-oxide field-effect transistor ('MOSFET') 206. A source of the MOSFET 206 is connected to another voltage (VSSA) power supply rail 208 of the second voltage domain. Typically the power supply rail 208 is common to both the first and second voltage domains and is connected to chassis or ground, so that its voltage VSSA is zero. A drain of the MOSFET 206 is connected to an active-low output terminal 210. A p-type MOSFET 212 has a source connected to a higher voltage (VDDH) power supply rail 214 of the second voltage domain. The MOSFET 212 has a drain connected to the active-low output terminal 210 and a gate connected to the active-high output terminal 204. A p-type MOSFET 216 has a source connected to the VDDH power supply rail 214, a drain connected to the active-high output terminal 204 and a gate connected to the active-low output terminal 210. An n-type MOSFET 218 has a source connected to the VSSA power supply rail 208 and a drain connected to the active-high output terminal 204. A gate of the MOSFET 218 is connected to an output of an inverter 220 having an input connected to the input terminal 202, the inverter 220 being supplied with power from a power supply rail 222 at the low supply voltage VDDL. The voltage level shifter 200 is therefore supplied with both VDDL and VDDH power supply voltages and power supply rail connections of the voltage level shifter to both the VDDL and VDDH domains are required.

Figure 3:
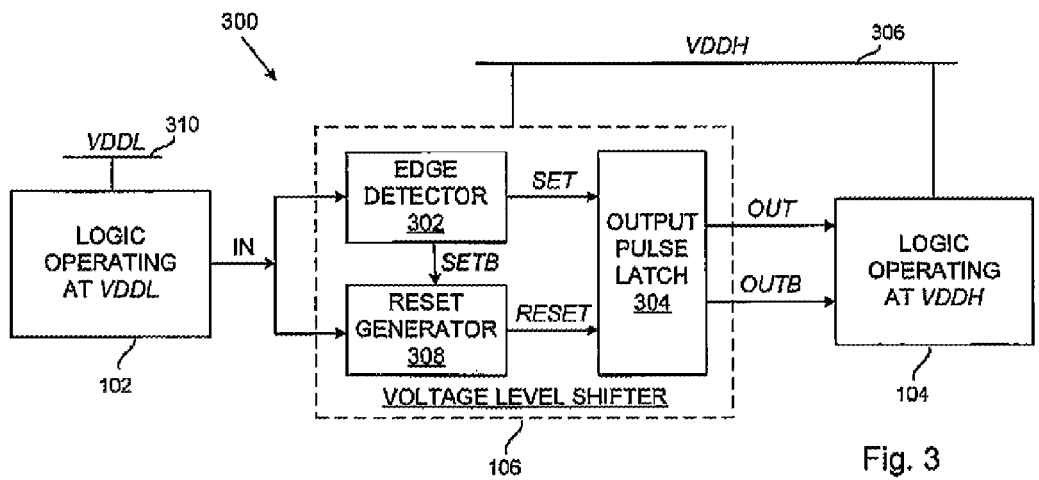
FIG. 3 is a schematic block diagram of a digital signal voltage level shifter in accordance with one embodiment of the invention.

FIG. 3 shows a logic circuit 300 with a digital signal voltage level shifter in accordance with one embodiment of the present invention, given by way of example. The logic circuit 300 is of the kind shown in FIG. 1, comprising logic circuits 102 operating in a first voltage domain supplied with power at a first supply voltage, logic circuits 104 operating in a second voltage domain supplied with power at a second supply voltage and a voltage level shifter 106. Again, the first voltage domain 102 operates at a lower supply voltage VDDL and the second voltage domain 104 operates at a higher supply voltage VDDH, although the voltage level shifter 106 may alternatively be adapted to shift the voltage levels of the input signals from the higher voltage level VDDH to the lower voltage level VDDL. In this example, the first supply voltage VDDL may be 1.2 V and the second supply voltage VDDH may be 3.0 V.

The digital signal voltage level shifter 106 of FIG. 3 comprises an edge detector 302 for detecting assertion of a digital input signal IN from the logic circuit 102 in the source voltage domain, and an output module 304 triggered by the edge detector 302 for asserting a digital output signal OUT corresponding to the digital input signal IN for the logic circuit 104 in the destination voltage domain. The edge detector 302 and the output module 304 are supplied with power by connection to a power supply rail 306 only of the destination voltage domain 104, that is to say, without connection to a power supply rail such as 310 of the source voltage domain.

In this example of an embodiment of the invention, the output module 304 comprises a set-reset latch. The edge detector 302 asserts a set signal SET in response to the assertion of the digital input signal IN, and the signal SET is applied to a set input of the output module 304. The digital signal voltage level shifter 106 of FIG. 3 also includes a reset generator 308 for asserting a reset signal RESET with a delay in response to subsequent de-assertion of the digital input signal IN, and the signal RESET is applied to a reset input of the output module 304. The output module 304 asserts the digital output signal OUT in response to assertion of the set signal SET and de-asserts the digital output signal OUT in response to the reset signal RESET. The reset generator 308 is also supplied with power by connection to the power supply rail 306 only of the destination voltage domain, without connection to a power supply rail such as 310 of the source voltage domain.

Figure 4:
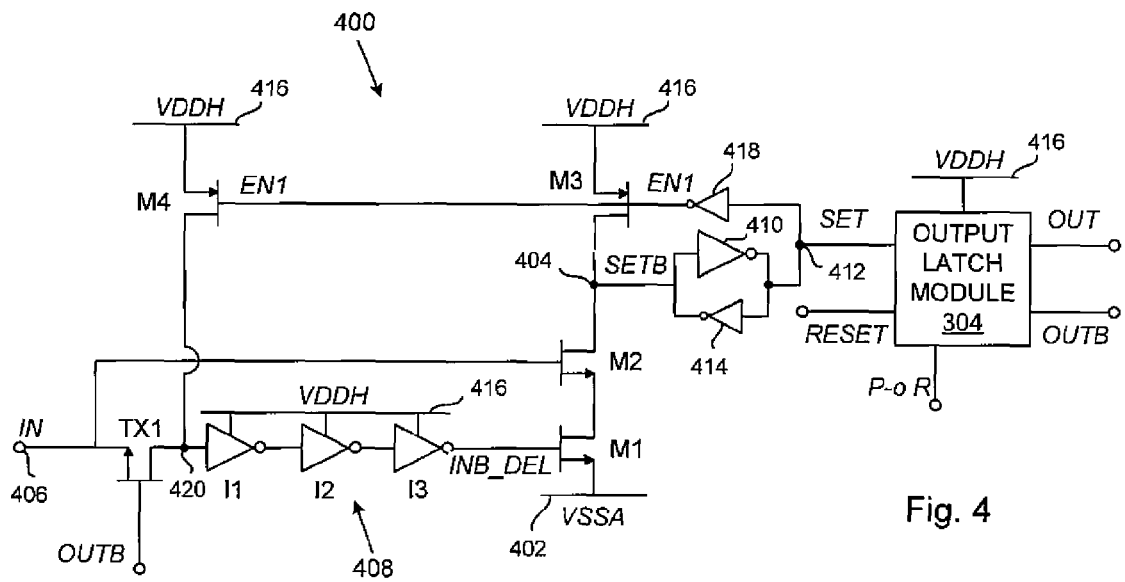
FIG. 4 is a simplified circuit diagram of an edge detector and output module in the digital signal voltage level shifter of FIG. 3.

An example of an embodiment 400 of the edge detector 302 is shown in FIG. 4. The edge detector 400 includes a trigger which is activated for detecting the assertion of the digital input signal, an edge detector latch set by the trigger for triggering the output module to assert the digital output signal, and a de-activator for de-activating the trigger when the digital output signal is asserted.

The trigger of the edge detector 400 comprises stacked n-type MOSFETS M1 and M2 with a source of the MOSFET M1 connected to a VSSA power supply rail 402 of the power supply 306, a drain of the MOSFET M1 connected to a source of the MOSFET M2 and a drain of the MOSFET M2 connected to a node 404 at which an active-low pulse signal SETB is produced. A gate of the MOSFET M2 is connected to an input terminal 406 which receives the input signal IN. A gate of the MOSFET M1 is connected to an output of a delay and inverter circuit 408 which produces a signal INB_DEL whose leading edge is delayed relative to the leading edge of the input signal IN. In this example, the delay and inverter circuit 408 comprises three inverters I1, I2 and I3 connected in series.

The latch of the edge detector 400 comprises an inverter 410 whose input is connected to the node 404 and whose output is connected to a node 412 at which the active-high signal SET is produced. The node 412 is connected to apply the active-high signal SET to the set input of the output module 304. The latch of the edge detector 400 also comprises an inverter 414 of less gain than the inverter 410 whose input is connected to the node 412 and whose output is connected to the node 404 to maintain the signals SET and SETB in the absence of other voltage applied to the node 404. The gain of the inverter 414 may be half that of the inverter 410, for example.

The de-activator of the edge detector 400 comprises a p-type MOSFET M3 having a source connected to a higher voltage (VDDH) power supply rail 416 of the power supply 306, a drain connected to the node 404 and a gate connected to an output of an inverter 418 whose input is connected to the node 412 and which applies to the gate of the MOSFET M3 an active low signal EN1, which follows the active-high set signal SET with a small delay. The de-activator of the edge detector 400 also comprises a p-type MOSFET M4 having a source connected to the higher voltage (VDDH) power supply rail 416 of the power supply 306, a drain connected to a node 420, which is connected to the input of the delay and inverter circuit 408, and a gate connected to the node 412 to receive the active-low signal EN1. The de-activator of the edge detector 400 also comprises an n-type MOSFET TX1 having a source connected to the terminal 406 to receive the input signal IN, a drain connected to the node 420 and to the input of the delay and inverter circuit 408, and a gate connected to an active-low output of the output module latch 304 to receive an active-low output signal OUTB.

Figure 5:
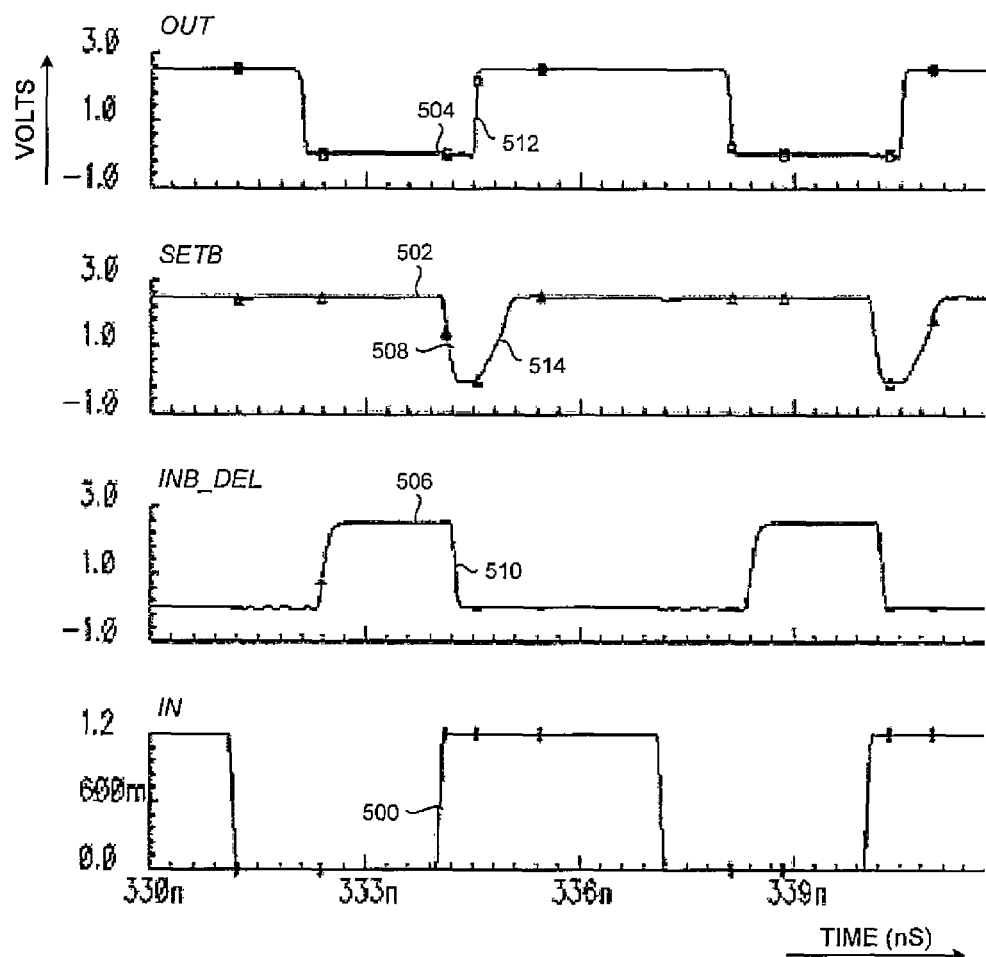
FIG. 5 is graph of the variation over time of various signals of the edge detector and output module of FIG. 4.

In operation, as illustrated in FIG. 5, until a rising leading edge 500 of the input signal IN occurs, the MOSFET M2 is turned OFF by the low input signal IN applied to its gate. The active-low set signal SETB is high as shown at 502, the active-high output signal OUT is low as shown at 504 and the complementary active-low output signal OUTB is high. The signal EN1 is high and maintains the MOSFET M4 OFF, and the MOSFET TX1 pulls the node 420 down towards IN, which is low. The output INB_DEL of the delay and inverter circuit 408 is therefore high as shown at 506, which will turn the MOSFET M1 ON when the MOSFET M2 pulls the drain of M1 high.

When the rising leading edge 500 of the input signal IN occurs, the stack of MOSFETs M1 and M2 turns ON and the signal SETB at the node 404 is pulled down towards VSSA, as shown at 508. At the same time, the voltage of the source of the MOSFET TX1 rises, but remains less than its gate voltage OUTB, since the input voltage is in the low, source voltage VDDL domain, at 1.2 V in this example, whereas the active-low output signal OUTB is high and close to the supply voltage VDDH of the destination voltage domain, 3.0 V in this example. The rising edge 500 of the input signal IN is therefore applied through the MOSFET TX1 to the input of the delay and inverter circuit 408. The delay and inverter circuit 408 triggers a delayed falling edge 510 in its output INB_DEL after its input voltage reaches a settable threshold. The trigger threshold is determined by the noise margin for the input signal IN and, in one example, is set at approximately 0.62 times the power supply voltage level of the low, source voltage VDDL domain. In the meantime, the falling edge 508 of the signal SETB at the node 404 causes the edge detection latch 410, 414 to produce a rising edge of the signal SET at the node 412 which sets the output signal OUT of the output latch 304 to high as shown at 512.

Several leakage paths would exist, even if only temporarily, after the latching of the output latch 304 to high at 512. However, the de-activator of the edge detector 400 operates to interrupt such leakage paths rapidly. As soon as the output signal OUT of the output latch 304 rises as shown at 512 to detect the input signal IN, the complementary output signal OUTB falls, turning OFF the MOSFET TX1. The MOSFET TX1 being OFF thus isolates the input terminal 406 and the source voltage domain from leakage through the inverter I1 to the supply rails 402 and 416 of the destination voltage domain, even if the input voltage IN is sluggish or hovers around the threshold value of the delay and inverter circuit 408. At the falling edge of the signal EN1 applied to the gate of the MOSFET M4, the input of the inverter I1 is pulled up towards VDDH by the p-type MOSFET M4. Thus the input of I1 is at a well defined voltage of VDDH, preventing any leakage in I1.

The falling edge 508 of the signal SETB at the node 404 pulls down the drain of the MOSFET M3, which is then turned ON by the signal EN1 falling after a short delay due to the inverters 410 and 418. The falling edge 510 of the output INB_DEL of the delay and inverter circuit 408 rapidly turns OFF the MOSFET M1. The signal SETB at the node 404 is then pulled high again as shown at 514 through the MOSFET M3 and the edge detection latch 410, 414 maintains low the signal SET at the node 412. The rising signals SETB and EN1 then turn OFF again the MOSFET M3, leaving the node 404 isolated by the OFF states of the MOSFET M3 and the MOSFET stack M1 and M2.

The rising edge 514 of the signal EN1 applied to the gate of the MOSFET M4 turns it OFF, isolating the node 420 from the power supply rail 416 as long as the signal EN1 is asserted, even when the active-low output signal OUTB of the output latch 304 is subsequently asserted by a reset pulse RESET. When the signal EN1 at the gate of the MOSFET M4 goes high, the node 420 is floating. Since the node 420 has no leakage path to ground, it will retain its value at VDDH.

Figure 6:
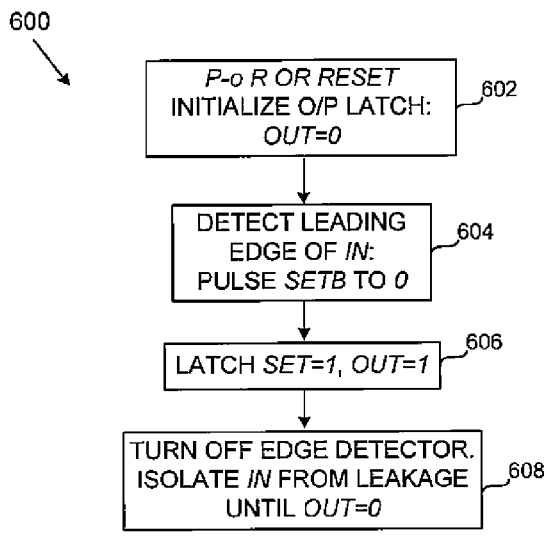
FIG. 6 is a flow chart illustrating the operation of an edge detector and output module in a digital signal voltage level shifter in accordance with one embodiment of the invention.

FIG. 6 summarises a method of shifting digital signal voltage levels performed in a destination voltage domain applicable to the digital voltage level shifter illustrated by FIGS. 3 to 5. The method 600 shown in FIG. 6 comprises edge detection and output signal assertion. The edge detection includes detecting a leading edge of assertion of a digital input signal from a logic circuit in a source voltage domain and triggering the output signal assertion. The output signal assertion includes asserting a digital output signal corresponding to the digital input signal for a logic circuit in the destination voltage domain. The edge detection and the output signal assertion are supplied with power by connection to a power supply only of the destination voltage domain.

In more detail, in the example of the method shown in FIG. 6 an output latch is initialized at 602 by the power-on reset signal PoR or the reset signal RESET to de-assert its output signal OUT. At 604, a leading edge of an input signal IN is detected, asserting a pulse SETB which is applied to a detector latch. At 606, the detector latch is set to generate a corresponding signal SET which is applied to the output latch, to assert its output signal OUT. Once the leading edge of the input signal IN has been detected and the output signal OUT asserted, the detection elements are turned OFF at 608 to isolate the input from leakage, until the output signal OUT is de-asserted again.

Figure 7:
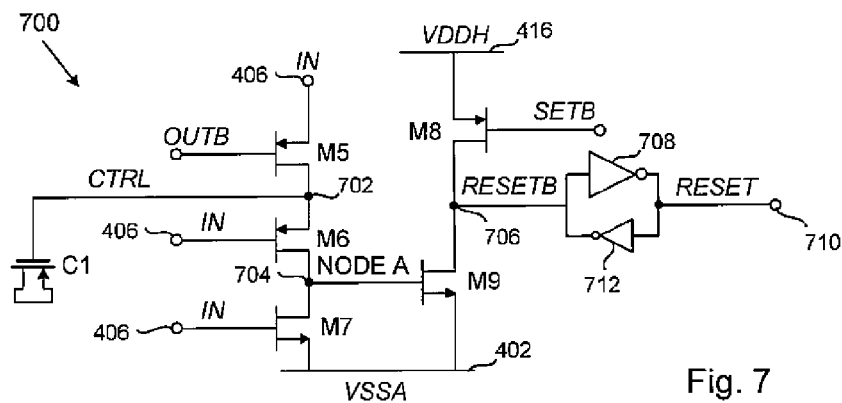
FIG. 7 is a simplified circuit diagram of a reset module in the digital signal voltage level shifter of FIG. 3.

The output signal OUT is de-asserted by the reset generator 308 asserting the reset signal RESET applied to the output module 304. An example of an embodiment 700 of the reset generator 308 is shown in FIG. 7.

The reset generator 700 asserts the reset signal RESET in response to de-assertion of the digital input signal IN, and the output module asserts the digital output signal OUT in response to assertion of the set signal SET and de-asserts the digital output signal OUT in response to the reset signal RESET.

In this example of an embodiment of the invention, the reset generator 700 comprises a first switch M5 which is OFF when the digital output signal OUT is de-asserted and/or the digital input signal IN is de-asserted. The first switch M5 is ON when the digital output signal OUT is asserted and the digital input signal IN is asserted. A capacitor C1 is charged by the digital input signal IN through the first switch M5 when ON. A second switch M6 is OFF when the digital input signal IN is asserted and is ON so as to conduct a charge on the capacitor C1 when the digital input signal is de-asserted. A third switch M9 is OFF when the second switch M6 is OFF so as to enable de-assertion of the reset signal RESET and is turned ON in response to the charge on the capacitor C1 so as to assert the reset signal RESET when the second switch M6 is ON. The first and second switches M5 and M6 are arranged to prevent leakage of the digital input signal IN to the power supply of the destination voltage domain when either of the first and second switches is OFF.

In more detail, the first switch M5 of the reset generator 700 comprises a p-type MOSFET having a source connected to the input terminal 406 which receives the input signal IN directly, without interposition of the de-activator MOSFET TX1 of the edge detector 400. The first switch M5 also has a gate connected to receive the active-low output signal OUTB from the output module 304, and a drain connected to a node 702. The capacitor C1 has one plate connected to the node 702 and another plate connected to a fixed voltage, such as a power supply rail. The second switch M6 comprises a p-type MOSFET having a source connected to the node 702, a gate connected to the input terminal 406 to receive the input signal IN, and a drain connected to a node 704. An n-type MOSFET M7 has a drain connected to the node 704, a gate connected to the input terminal 406 to receive the input signal IN, and a source connected to the low voltage power supply rail 402 of the destination voltage domain.

The third switch M9 comprises an n-type MOSFET having a drain connected to a node 706, a gate connected to the node 704, and a source connected to the low voltage power supply rail 402 of the destination voltage domain. A p-type MOSFET M8 has a source connected to the high voltage power supply rail 416 of the destination voltage domain, a gate connected to receive the active-low pulse set signal SETB from the node 404 of the edge detector 400, and a drain connected to the node 706 at which an active-low pulse reset signal RESETB is produced. The reset generator 700 also comprises a reset latch which comprises an inverter 708 whose input is connected to the node 706 and whose output is connected to a node 710 at which the active-high signal RESET is produced. The node 710 is connected to apply the active-high signal RESET to the reset input of the output module 304. The latch of the reset generator 700 also comprises an inverter 712 of less gain than the inverter 708 whose input is connected to the node 710 and whose output is connected to the node 706 to maintain the signals RESET and RESETB in the absence of other voltage applied to the node 706. The gain of the inverter 712 may be half that of the inverter 708, for example.

Figure 8:
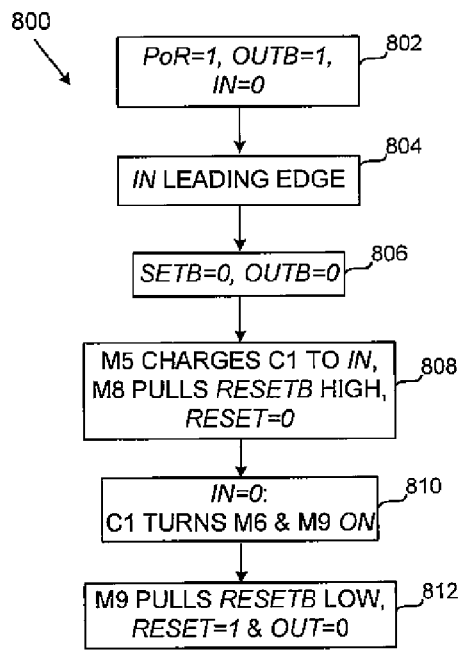
FIG. 8 is a flow chart illustrating the operation of the reset module of FIG. 7.

FIG. 8 summarises the operation of the reset generator 700 of the digital signal voltage level shifter 400. In the method 800 of FIG. 8, the edge detector 400 asserts a set signal SET in response to the assertion of the digital input signal IN. The reset generator 700 asserts a reset signal RESET with a delay in response to the de-assertion of the digital input signal IN. The output module 304 asserts the digital output signal OUT in response to assertion of the set signal SET and de-asserts the digital output signal in response to the reset signal RESET.

In the method 800, at 802, on power-up of the voltage level shifter 400, the power-on reset signal PoR is asserted to initialize the level shifter, ensuring that initially the active-high output signal OUT is de-asserted and the active-low output signal OUTB is asserted at VDDH, the digital input signal IN being initially de-asserted. At 804, a leading edge of the digital input signal IN occurs. When the leading edge of the digital input signal IN is detected, at 806, the active-low set pulse signal SETB and the active-low output signal OUTB are de-asserted. At 808, the MOSFET M5 charges the capacitor C1 towards the voltage of the asserted digital input signal IN of the low voltage domain 102. At the same time, the MOSFET M8 pulls the voltage of the node 706 towards the voltage VDDH of the high voltage rail 416, asserting the active-low reset signal RESETB and de-asserting the active-high reset signal RESET.

When the digital input signal IN is de-asserted, at 810, the charge on the capacitor C1 turns ON the MOSFET M6 since the source to gate voltage of the MOSFET M6 is greater than its switching threshold and the MOSFET M6 applies the voltage of the capacitor C1 to the MOSFET M9. At 812, the MOSFET M9 pulls the voltage of the node 706 towards the voltage VSSA of the power supply rail 402, de-asserting the active-low reset signal RESETB and asserting the active-high reset signal RESET.

Figure 9:
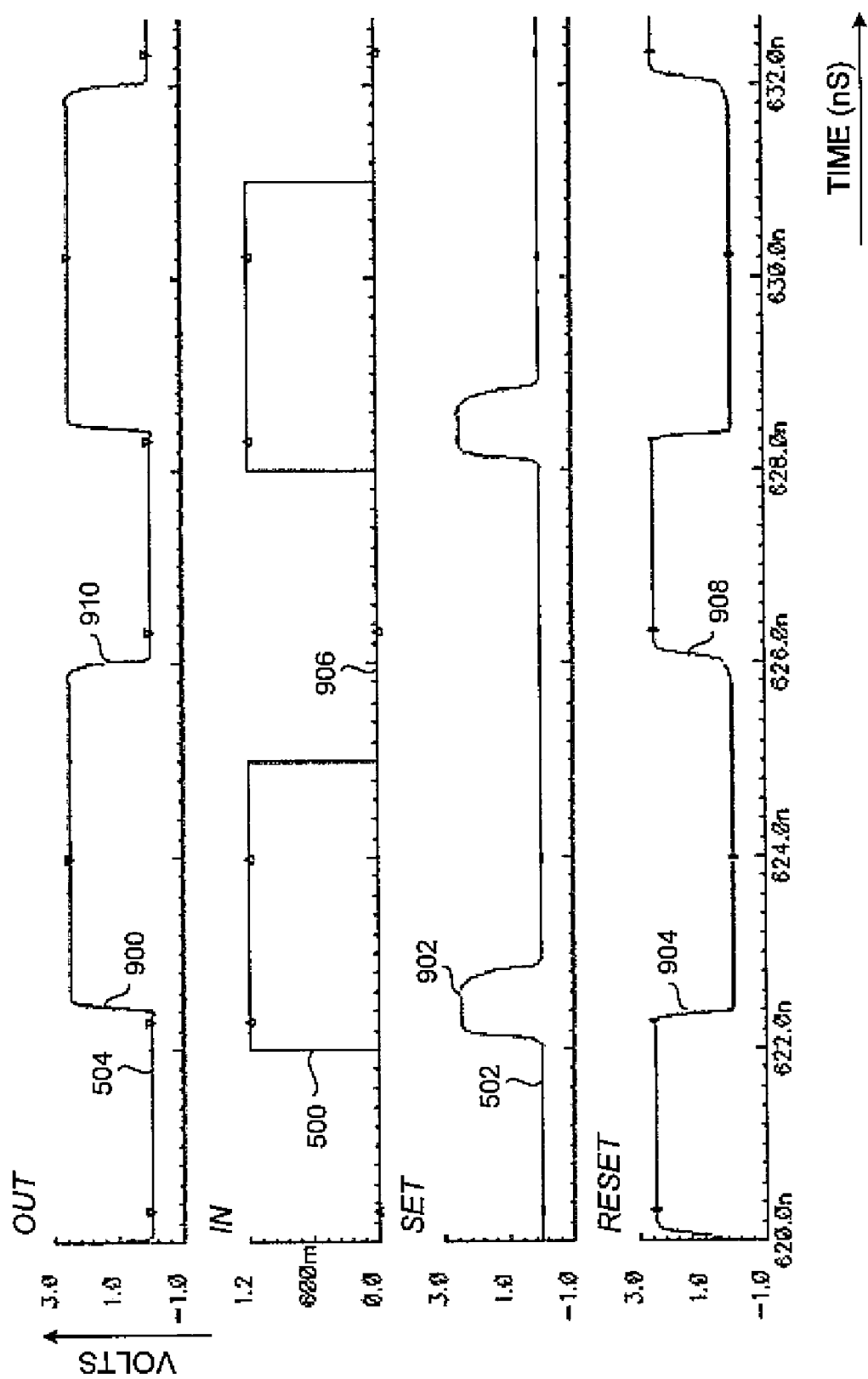
FIG. 9 is graph of the variation over time of various signals of the reset module of FIG. 7 and the output module of FIG. 3.

In more detail, as illustrated in FIGS. 5 and 9, until a rising leading edge 500 of the input signal IN occurs, the MOSFETs M5 and M7 are turned OFF by the low input signal IN applied to the source of the MOSFET M5 and to the gate of the MOSFET M7. The active-low pulse set signal SETB is high and active-high set signal SET is low as shown at 502, so that the MOSFET M8 is turned OFF. The output signal OUT is low as shown at 504 and the complementary active-low output signal OUTB is high.

When the input signal IN becomes high, the voltage of the source voltage domain, 1.2 V in this example, is applied to the source of the MOSFET M5 and to the gates of the MOSFETs M6 and M7. When the rising leading edge 500 of the input signal IN is detected, the active-high output signal OUT becomes high as shown at 900 and the active-low output signal OUTB becomes low, turning ON the MOSFET M5 and applying the input signal IN to the node 702 and the capacitor C1, which charges towards the voltage of the source voltage domain through M5. The MOSFET M6 is OFF, since its gate voltage is higher than its source voltage, held down by the capacitor C1. Accordingly, the MOSFET M6 isolates the input terminal 406 and the source voltage domain from leakage through the MOSFET M7 to the supply rail 402 of the destination voltage domain. At the same time, the active-high set signal SET becomes high as shown at 902 and the active-low set signal SETB becomes low, turning ON the MOSFET M8, pulling up the voltage at the node 706, asserting the active-low pulse reset signal RESETB and de-asserting the active-high reset signal RESET as shown at 904. The MOSFET M9 is held OFF by the MOSFET M7 pulling down the voltage at the node 704 applied to the gate of the MOSFET M9. The inverters 708 and 712 latch the active-high reset signal RESET de-asserted at the node 710.

When the input signal IN becomes low as shown at 906, the MOSFET M5 is turned OFF by its falling source voltage but the voltage across the capacitor C1 maintains the source voltage of the MOSFET M6, which turns ON, applying the capacitor voltage to the node 704 and the gate of the MOSFET M9. The MOSFET M9 pulls the voltage at the node 706 down, de-asserting the active-low pulse reset signal RESETB. The inverters 708 and 712 latch the active-high reset signal RESET asserted at the node 710. The active-high reset signal RESET applied to the output module 304 pulls the active-high output signal OUT low as shown at 910 and the active-low output signal OUTB high, which the output module 304 maintains normally until detection of the next leading edge of the input signal IN.

On power-up of the voltage level shifter 400, a power-on reset signal PoR is generated by a suitable power management module (not shown). The power-on reset signal PoR is applied to the power-on reset input of the output module 304 to ensure that it is initially in a well-defined state, with the active-low output signal OUTB high, even in the presence of floating voltages at the isolated nodes 704 and 706, until the edge detector responds to a leading edge of the input signal IN. Accordingly, the reset generator 308 generates the reset signal RESET cleanly, while isolating the input terminal 406 from the low voltage rail 402 of the destination voltage domain.

It will be appreciated that the digital signal voltage level shifter, including the reset generator 308, is supplied with power by connection to the power supply rail 416 only of the destination voltage domain. The input terminal 406 supplies only sufficient current to turn ON the MOSFET M5 and charge the capacitor C1, apart from supplying the gate voltage for the MOSFETs M2, TX1, M6 and M7. No power supply rail from the source destination voltage domain is needed.

In the foregoing specification, the invention has been described with reference to specific examples of embodiments of the invention. It will, however, be evident that various modifications and changes may be made therein without departing from the broader spirit and scope of the invention as set forth in the appended claims.

For example, the semiconductor substrate described herein can be any semiconductor material or combinations of materials, such as gallium arsenide, silicon germanium, silicon-on-insulator (SOI), silicon, monocrystalline silicon, the like, and combinations of the above.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "de-assert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A digital signal voltage level shifter, comprising:
an edge detector for detecting assertion of a digital input signal from a first logic circuit in a source voltage domain;
an output module triggered by said edge detector for asserting a digital output signal corresponding to said digital input signal for a second logic circuit in a destination voltage domain, wherein the edge detector and the output module are supplied with power only from a power supply of the destination voltage domain; and
a reset generator connected to the output module for asserting a reset signal in response to subsequent de-assertion of the digital input signal, wherein the reset generator is supplied with power only from the power supply of the destination voltage domain;
wherein said reset generator comprises:
a first switch that is OFF when the digital output signal is de-asserted or the digital input signal is de-asserted, and is ON when said digital output signal is asserted and the digital input signal is asserted;
a capacitor charged by the digital input signal through the first switch when the first switch is ON;
a second switch that is OFF when the digital input signal is asserted and ON when said digital input signal is de-asserted to conduct a charge on the capacitor; and
a third switch that is OFF when the second switch is OFF to enable de-assertion of the reset signal and is ON in response to the charge on the capacitor so as to assert the reset signal when the second switch is ON, and wherein the first and second switches are arranged to prevent leakage of the digital input signal to the destination voltage domain power supply when either of the first and second switches is OFF, and wherein the edge detector asserts a set signal in response to the assertion of the digital input signal, and the output module asserts the digital output signal in response to assertion of the set signal and de-asserts the digital output signal in response to the reset signal.

2. The digital signal voltage level shifter of claim 1, wherein the output module comprises an output latch that is set by assertion of the set signal and reset by assertion of the reset signal.

3. A digital signal voltage level shifter, comprising:
   an edge detector for detecting assertion of a digital input signal from a first logic circuit in a source voltage domain;
   an output module triggered by said edge detector for asserting a digital output signal corresponding to said digital input signal for a second logic circuit in a destination voltage domain, wherein the edge detector and the output module are supplied with power only from a power supply of the destination voltage domain;
   a trigger that is activated for detecting the assertion of the digital input signal;
   an edge detector latch set by the trigger for triggering the output module to assert the digital output signal; and
   a de-activator for de-activating the trigger when the digital output signal is asserted.

4. A method of shifting a voltage level of a digital input signal generated in a source voltage domain from a first voltage level to a second voltage level, wherein the source voltage domain operates at the first voltage level, the method comprising the steps of:
   detecting a leading edge of the digital input signal with an edge detector;
   triggering assertion of a digital output signal in response to detection of the leading edge of the digital input signal with an output circuit; and
   providing the digital output signal to a destination circuit in a destination voltage domain, wherein the destination voltage domain operates at a second voltage level that is higher than the first voltage level, and wherein the edge detector and the output circuit are provided power only from the destination voltage domain, wherein a set signal is asserted in response to detection of the leading edge of the digital input signal, a reset signal generated by a reset generator that is asserted in response to subsequent de-assertion of the digital input signal, and the digital output signal is asserted in response to assertion of the set signal and de-asserted in response to the reset signal, wherein the reset generator is supplied with power only from the destination voltage domain, and wherein the edge detection includes:
   turning OFF a first switch when the digital output signal is de-asserted and/or the digital input signal is de-asserted, turning ON the first switch when the digital output signal is asserted and the digital input signal is asserted;
   charging a capacitor with the digital input signal via the first switch when ON;
   turning OFF a second switch when the digital input signal is asserted and turning ON the second switch to conduct a charge on the capacitor when the digital input signal is de-asserted; and
   turning OFF a third switch when the second switch is OFF to enable de-assertion of the reset signal and turning ON the third switch in response to said charge on said capacitor so as to assert the reset signal when the second switch is ON, wherein the first and second switches prevent leakage of the digital input signal to the power supply of said destination voltage domain when either of the first and second switches is OFF.

5. The method of shifting a digital signal voltage level of claim 4, wherein the output signal assertion comprises setting an output latch by asserting the set signal and resetting the output latch by asserting the reset signal.

6. The method of shifting a digital signal voltage level of claim 5, wherein the edge detection includes activating a trigger for detecting the assertion of the digital input signal, wherein an edge detector latch is set by the trigger for triggering the digital output signal assertion, and de-activating the trigger when the digital output signal is asserted.

* * * * *